United States Patent [19]

Fujiwara et al.

[11] Patent Number: 5,299,902

[45] Date of Patent: Apr. 5, 1994

[54] CHIP-TYPE ELECTRONIC ELEMENT SUPPLYING APPARATUS

[75] Inventors: Hiroyuki Fujiwara, Osaka; Takayuki Fujita, Hirakata; Shigetoshi Negishi, Suita; Kunio Tanaka, Kadoma; Hiroaki Terazawa, Osaka; Hidekazu Nakamura, Ibaraki; Takayoshi Kado, Katano, all of Japan

[73] Assignee: Matsushita Electric Industrial Co., Ltd., Osaka, Japan

[21] Appl. No.: 823,570

[22] Filed: Jan. 21, 1992

[30] Foreign Application Priority Data

Jan. 22, 1991 [JP] Japan .................. 3-005692

[51] Int. Cl.⁵ .................... B65H 5/28; H05K 13/04
[52] U.S. Cl. .................... 414/416; 414/403; 221/25; 29/740
[58] Field of Search ............... 414/403, 416, 477; 29/740; 221/25; 242/67.3 R

[56] References Cited

U.S. PATENT DOCUMENTS

| | | | |
|---|---|---|---|
| 4,620,655 | 11/1986 | Fujita | 226/109 |
| 4,735,341 | 4/1988 | Hamilton et al. | 221/25 X |
| 4,740,136 | 4/1988 | Asai et al. | 414/416 X |
| 4,768,915 | 9/1988 | Fujioka | 414/403 X |
| 4,923,089 | 5/1990 | Hineno et al. | 221/25 X |
| 5,020,959 | 6/1991 | Soth | 221/25 X |
| 5,191,693 | 3/1993 | Umetsu | 414/416 X |

FOREIGN PATENT DOCUMENTS

| | | |
|---|---|---|
| 0013979 | 8/1980 | European Pat. Off. . |
| 0277732 | 8/1988 | European Pat. Off. . |
| 2949196 | 7/1980 | Fed. Rep. of Germany . |
| 3424323 | 1/1985 | Fed. Rep. of Germany ........ 29/740 |
| 206693 | 9/1991 | Japan ..................... 29/740 |
| 2169262 | 7/1986 | United Kingdom . |

Primary Examiner—Michael S. Huppert
Assistant Examiner—Stephen Gordon
Attorney, Agent, or Firm—Stevens, Davis, Miller & Mosher

[57] ABSTRACT

Chip-type electronic elements are applied in line on the surface of a carrier tape before they are supplied to an automatic electronic-element supply apparatus so as to be automatically mounted on a printed circuit board. Side plates are disposed at an end portion of the body frame of the automatic electronic element supply apparatus for a chip-type electronic element mounting apparatus in such a manner that a plurality of carrier tape reels can be fastened to the side plates and the carrier tapes are discharged from the tape reels in a ratchet manner while moving adjacently in parallel to one another through another end portion of the body frame. Thus, a multiplicity of different kinds of electronic elements can be supplied from one supply apparatus.

3 Claims, 8 Drawing Sheets

CHIP-TYPE ELECTRONIC ELEMENT SUPPLYING APPARATUS

BACKGROUND OF THE INVENTION

1. Field of the Invention:

The present invention relates to a chip-type electronic element supplying apparatus for use in an apparatus for automatically mounting chip-type electronic elements on a printed circuit board.

Figure 13:
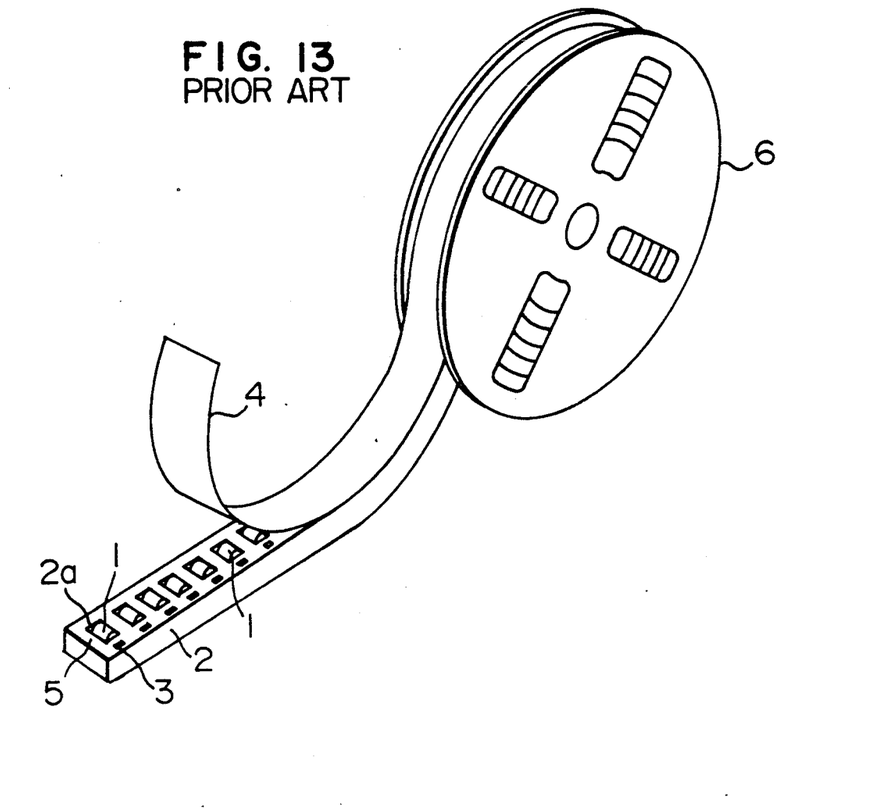
FIG. 13 is a perspective view which illustrates a state in which the chip-type electronic elements are covered with a tape.

2. Related Art Statement:

Chip-type electronic elements 1, formed variously as shown in FIGS. 12A to 12D are accommodated in recessed portions 2a formed in a carrier tape 2 which has conveyance holes 3 formed at predetermined intervals on either side of the carrier tape 2 as shown in FIG. 13. Thus, a taped electronic element group 5 is supplied to a user in a state where it is covered with a cover tape 4 and wound around a reel 6. The apparatus (omitted from illustration) for automatically mounting electronic elements is an apparatus arranged to sequentially take out the chip-type electronic elements 1 from the reel 6 so that they are then mounted on a circuit board. The chip-type electronic element supplying apparatus is a portion of the above-described apparatus for automatically mounting electronic elements.

Figure 14:
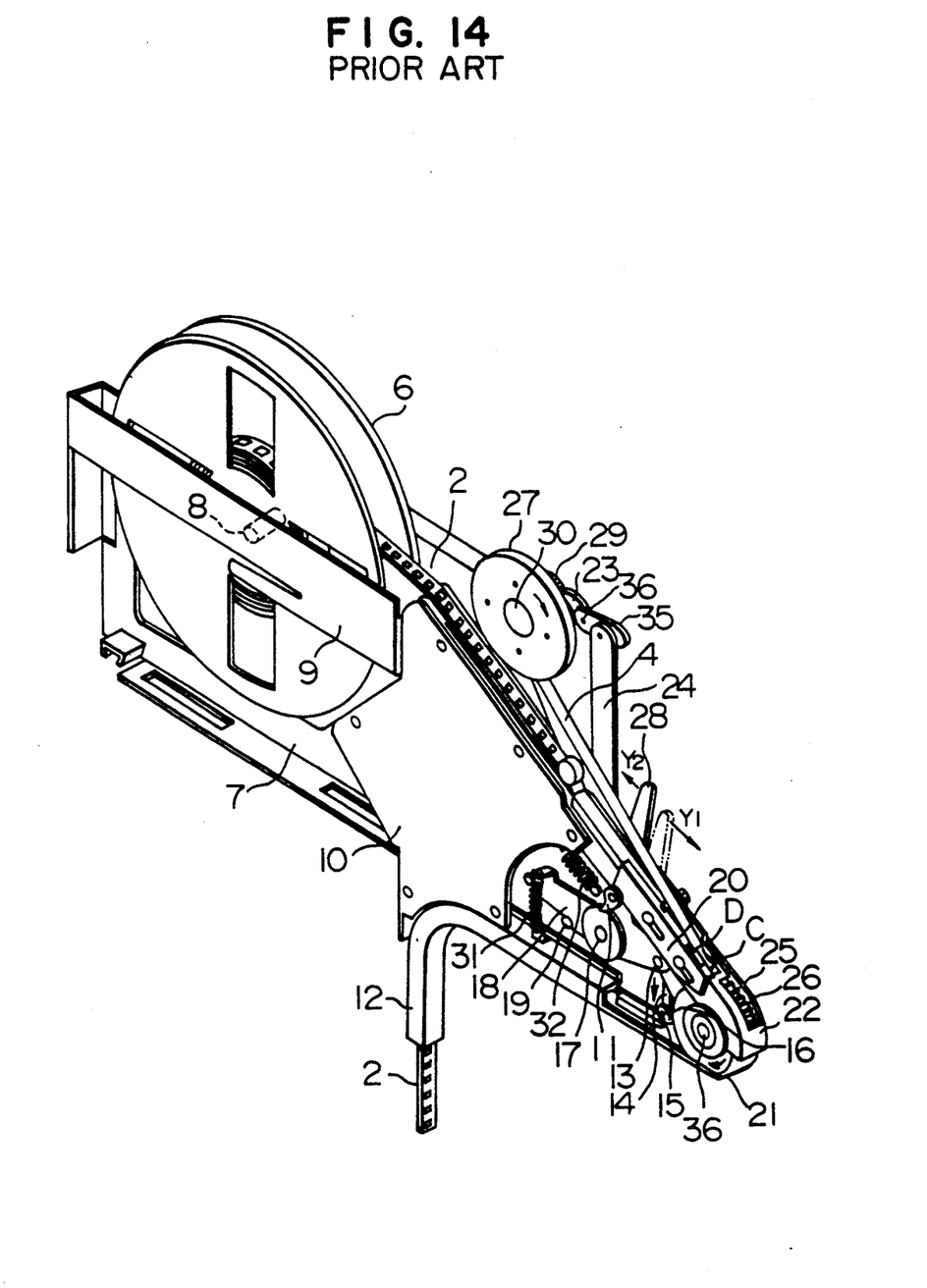
FIG. 14 is a perspective view which illustrates a conventional chip-type electronic element supplying apparatus.

FIG. 14 is a perspective view which illustrates a related-art chip-type electronic element supplying apparatus. Referring to FIG. 14, a carrier tape 2 taken out from the above-described reel 6 is guided to a feeding ratchet 25 so that a multiplicity of hooking claws 26 secured to the above-described feeding ratchet 25 are sequentially fastened to conveyance holes 3 formed in the carrier tape 2 when the feeding ratchet 25 is rotated. The carrier tape 2 is conveyed while being guided along the feeding ratchet 25 by a tape retainer 22 disposed above the feeding ratchet 25. The above-described cover tape 4 is turned by an angle of about 180° and is taken out in a direction opposite to the direction in which the carrier tape 2 is fed, at a position of a slit D formed in a slightly upstream (adjacent to the reel 6) of an opening portion C which is formed in the above-described tape retainer 22 and through which the electronic elements are taken out so that the cover tape 4 is separated from its carrier tape 2. The leading portion of the separated cover tape 4 is wound around a take-up reel 27.

The above-described opening portion C, through which the electronic elements are taken out, is opened when a shutter 20 is moved in a direction designated by an arrow $Y_2$ which opposes a direction designated by an arrow $Y_1$ via a reverse-rotation lever 11 disposed between a feeding lever 28 and the shutter 20 by an action of a kicker (omitted from illustration) provided for the apparatus (omitted from illustration) for automatically mounting electronic elements in synchronization with the action of the apparatus for automatically mounting electronic elements. That is, the above-described shutter 20 is movably fastened to the tape retainer 22 in such a manner that the shutter 20 covers the opening C through which the electronic elements are taken out when the feeding lever 28 is pulled in the direction $Y_2$ by a tension spring 32. A feeding ratchet lever 14 connected to the above-described feeding lever 28 by a connection pin 13 and arranged to act in synchronization with the action of the feeding lever 28 is moved downwards. As a result, a feeding ratchet claw 16 fastened to the feeding ratchet lever 14 via a supporting point 15 is returned by one pitch in a direction which opposes the direction of the rotation of the above-described feeding ratchet 25.

When the above-described feeding lever 28 is moved in the direction $Y_1$, a movable lever 18 having a supporting shaft 17 which is commonly used as the supporting shaft for the feeding lever 28 is upwards moved via a connection pin 19. Then, a take-up ratchet lever 35 is upwards moved around a rotational shaft 30 of the above-described take-up reel 27 by a connection rod 24 which establishes a connection between the movable lever 18 and the take-up ratchet lever 35. As a result, a take-up ratchet claw 23 fastened to the ratchet lever 35 via a supporting point 36 is returned by one or plural pitches in a direction which opposes a direction in which the take-up ratchet 29 is rotated.

In the above-described state in which the opening portion C through which the electronic elements are taken out is opened, an operation of adsorbing the electronic elements and an operation of mounting the same on the printed circuit board (omitted from illustration) are performed by a vacuum adsorbing head (omitted from illustration). Since, the above-described manufacturing process is not relevant to the structure of the chip-type electronic element supplying apparatus, this process is omitted here.

When the pushing force given to the feeding lever 28 from the above-described kicker is released in a state shown in FIG. 14, the feeding lever 28 is returned in the direction $Y_2$ by the urging force of the tension spring 32. As a result, the feeding ratchet lever 14 is moved upwards and the feeding ratchet claw 26 upwards pushes the feeding ratchet 25 in synchronization with the above-described upward movement of the feeding ratchet lever 14 so that the feeding ratchet 25 is rotated by a predetermined number of pitches in the tape feeding direction. Then, the hooking claw 26 secured to the feeding ratchet 25 conveys the carrier tape 2 by a predetermined number of pitches in the direction $Y_1$. At this time, the shutter 20 is, similarly to the carrier tape 2, moved in the direction $Y_1$ via the reverserotation lever 11. As a result, a state where the opening portion C through which the electronic elements are taken out is covered by the shutter 20 is realized. Therefore, the carrier tape 2 is moved in a state where the above-described electronic elements 1 are covered with the shutter 20. As a result, undesirable pop-out of the chip-type electronic elements 1 from the recessed portions 2a of the carrier tape 2 can be prevented.

On the other hand, the take-up ratchet 29 is rotated in a direction designated by an arrow shown in FIG. 14 by the take-up ratchet claw 23 when the above-described feeding lever 28 is returned. The cover tape 4 separated at the slit D is wound by a take-up reel 27 to which the feeding ratchet 29 is secured by a predetermined length (a length corresponding to a predetermined pitch of feeding of the carrier tape 2). At this time, the movable lever 18 is downwards moved when the feeding lever 28 is returned in the direction $Y_2$. During the above-described movement process, the movable lever 18 is given the urging force determined by the tension spring so as to keep an interval from the connection pin 19.

As described above, the structure is constituted in such a manner that predetermined rotational force is always given to the take-up reel 27 by the tension spring 31 via the connection rod 24, the take-up ratchet claw 23 and the take-up ratchet 29 to separate the cover tape 4.

Furthermore, the reel 6 is inserted into the supporting shaft 8 provided for the body cover 7 so as to be held by a leaf spring 9 from the side surface. Therefore, the horizontal deviation of the reel 6 is prevented and the reel 6 is stably held so that the looseness of the carrier tape 2 taken place at the time of feeding thereof is prevented. Reference numeral 10 represents a front cover, 21 represents a carrier tape receiving plate and 12 represents a carrier tape discharge port.

Recently, there is a desire of reducing (in particular, reducing the space between the supply apparatuses) the thickness of the chip-type electronic element supplying apparatus in order to improve the mounting tactic of the apparatus for automatically mounting electronic elements. Therefore, the related-art chip-type electronic element supplying apparatus constituted as shown in FIG. 13 encounters a problem in that there is a limit present in reducing the thickness of the supply apparatus due to the unsatisfactory rigidity of the body of the supply apparatus and thereby the electronic elements cannot be stably supplied.

SUMMARY OF THE INVENTION

An object of the present invention is to provide a chip-type electronic element supplying apparatus capable of overcoming the above-described conventional problems and thereby capable of improving the mounting tactic.

In order to achieve the above-described object, according to the present invention, there is provided a chip-type electronic element supplying apparatus comprising: a body frame; a plurality of reels to each of which is constituted by applying a cover tape to a carrier tape having accommodating portions that accommodate chip-type electronic elements at predetermined intervals and wound up; reel side plates which are disposed at an end portion of the body frame and to which a plurality of the reels are rotatively fastened; a recessed portion which is formed in another end portion of the body frame and in which tape feeding mechanisms, each of which has a feeding claw which is engaged to the carrier tape carrying the taped electronic elements and taken out from the reel in order to intermittently convey the carrier tape, are disposed by the number corresponding to the number of the reels; tape retainers disposed above the feeding mechanism; a cover tape take-up portion for taking out the cover tape separated from the carrier tape by means of a cut portion to a portion of the taper retainer to take up the cover tape, the cover-tape take-up portion being disposed in an intermediate portion of the body frame; and an element taking-out portion which is disposed in the front portion of the tape retainer and through which the chip-type electronic elements are taken out from the carrier tape.

As a result of the above-described structure, the necessity of reducing the thickness of the chip-type electronic element supplying apparatus can be eliminated and thereby the rigidity of the body frame can be maintained satisfactorily strong, causing an effect to be obtained in that the mounting tactics can be improved.

Other and further objects, features and advantages of the invention will appear more fully from the following description.

DESCRIPTION OF THE PREFERRED EMBODIMENTS

Figure 1:
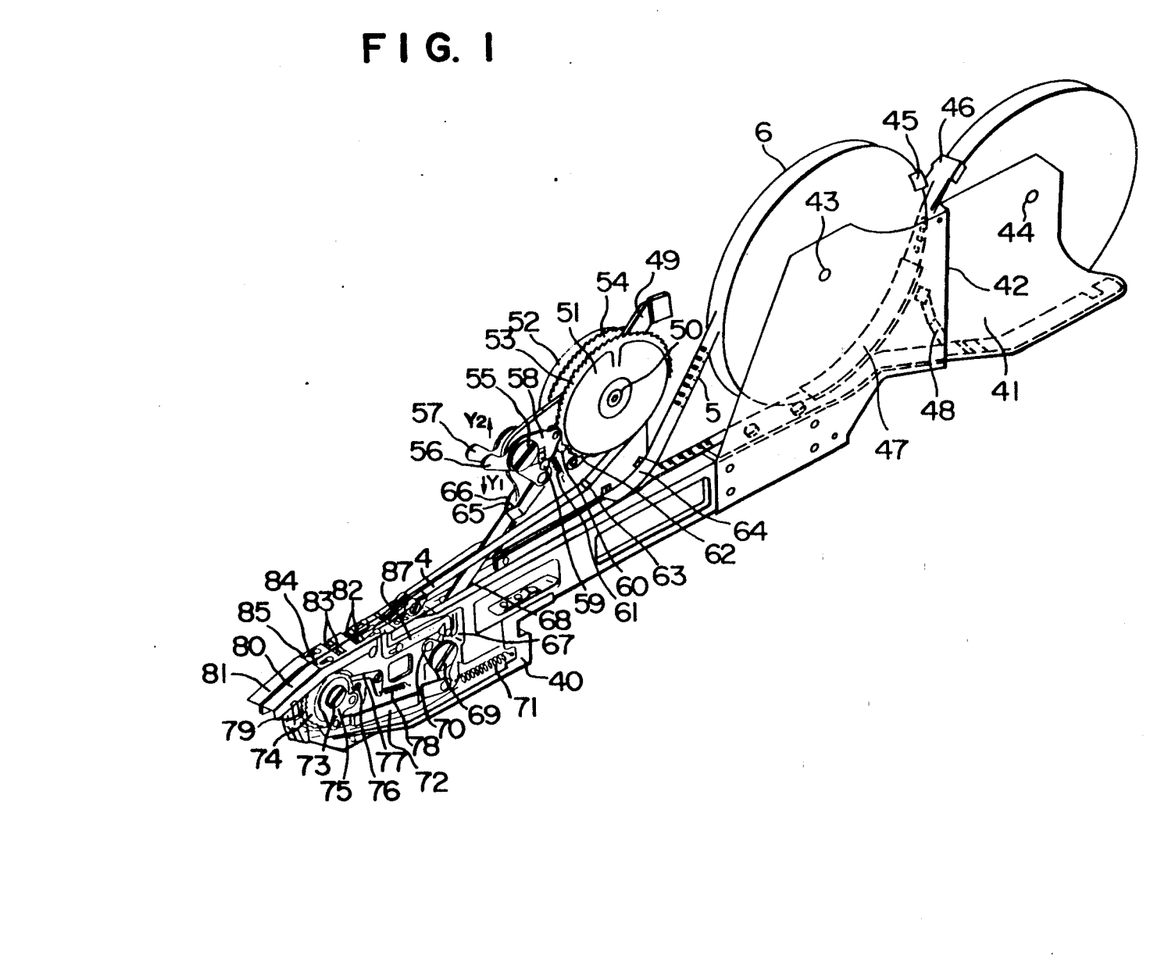
FIG. 1 is a perspective view which illustrates a chip-type electronic element supplying apparatus according to the present invention.
Figure 2:
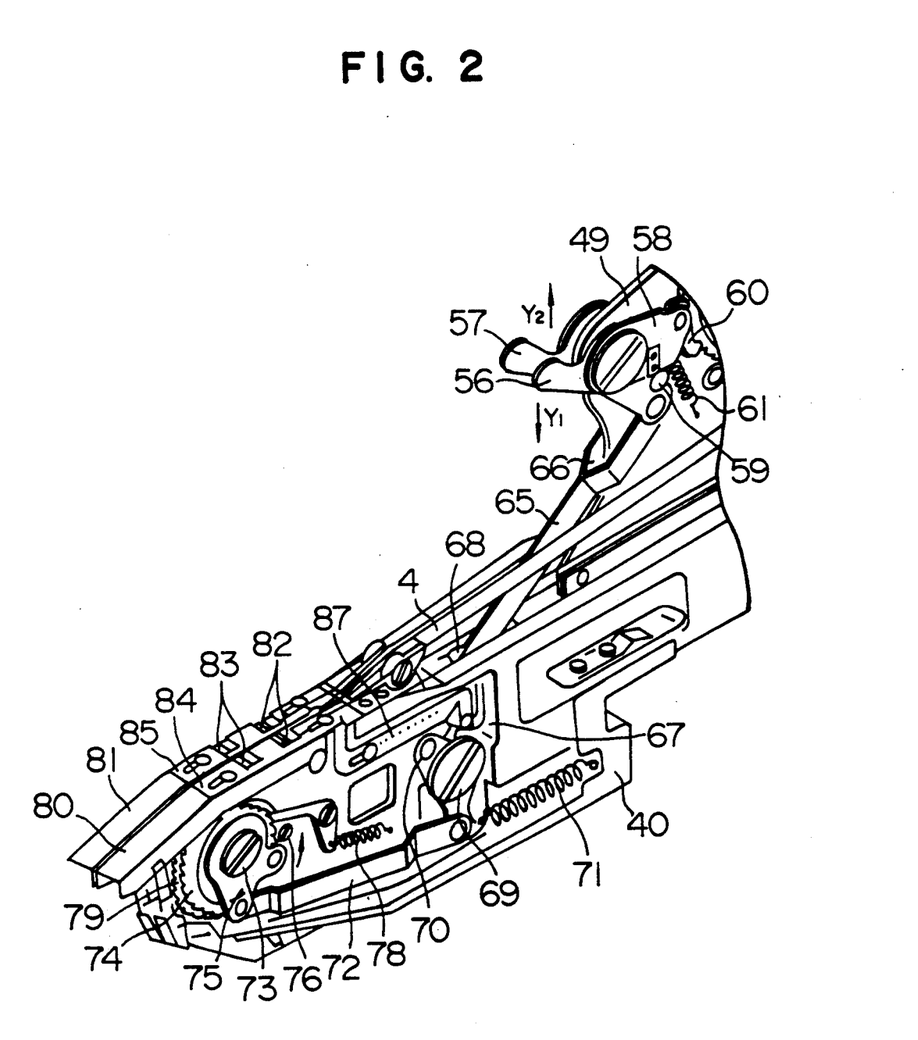
FIG. 2 is an enlarged perspective view which illustrates an essential portion of the same.
Figure 3:
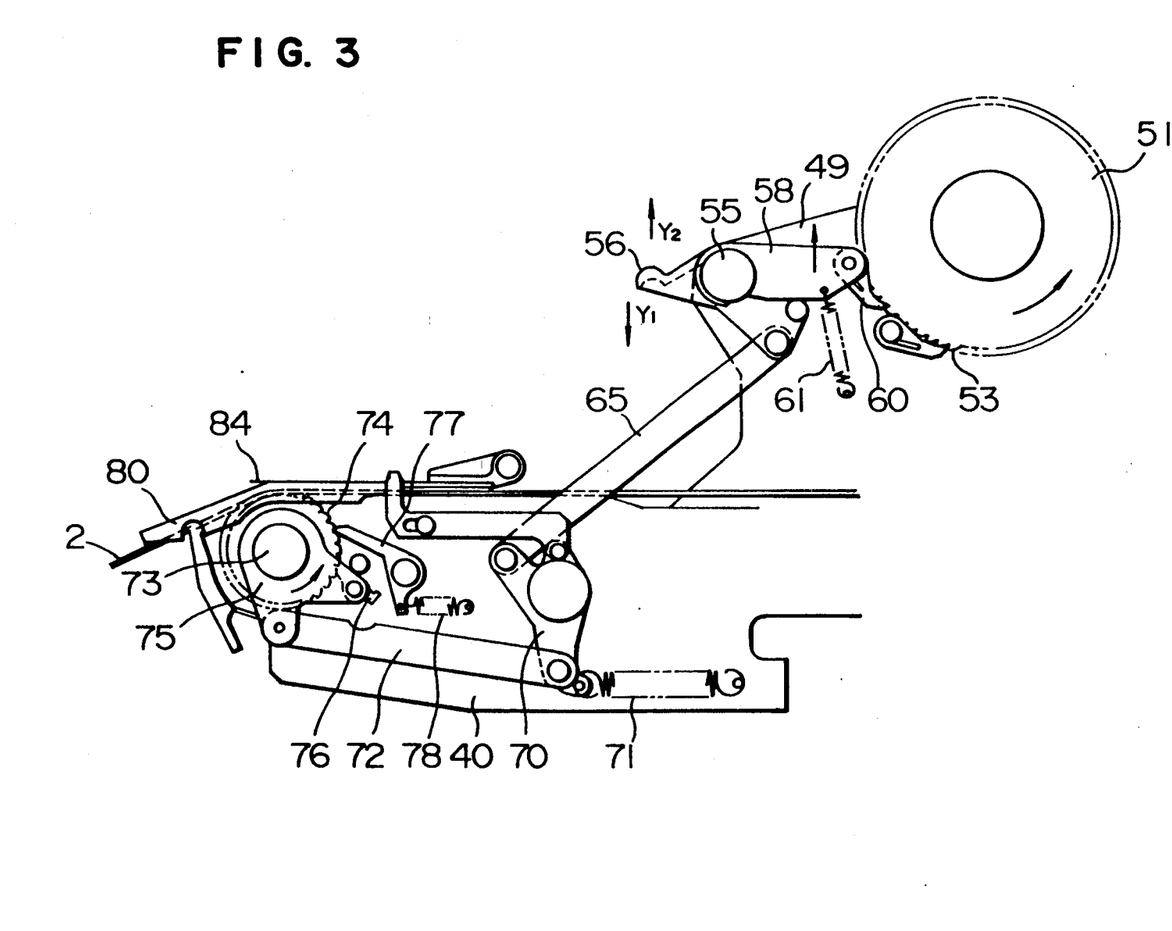
FIG. 3 is a front elevational view which illustrates an essential portion of the same.

Preferred embodiments of the present invention will now be described. FIG. 1 is a perspective view which illustrates an embodiment of a chip-type electronic element supplying apparatus according to the present invention. FIG. 2 is an enlarged perspective view which illustrates an essential portion of the apparatus and FIG. 3 is a front elevational view which illustrates the same. Since the structure arranged in such a manner that a taped electronic group 5, constituted by accommodating chip-type electronic elements 1 in recessed portions 2a of a carrier tape 2 before they are sealed by a cover tape 4, is wound around a reel 6, is the same as the above-described structure, the same reference numerals are given to them and their specific descriptions will be omitted here.

Referring to FIGS. 1 to 3, reel side plates 41 are fastened to an end portion of a body frame 40 which is made of an aluminum alloy or the like. Each of the reel side plates 41 has a size which enables the two reels 6 to be fastened in its longitudinal direction. Furthermore, the reel side plate 41 has a stepped portion 42 for the purpose of fastening the front and the rear reels 6 while deviating them by a degree corresponding to the width of the carrier tape 2. Furthermore, reel shafts 43 and 44 to which the two reels 6 are fastened are secured to the above-described reel side plates 41 so that the reels 6 are rotatably fastened to the reel shafts 43 and 44. In addition, reel retainers 45 and 46 for holding the corresponding outer surfaces of the reels 6 respectively fastened to the reel shafts 43 and 44 are disposed in the upper portion of an intermediate portion of the reel side plates 41. Furthermore, tape guide plates 47 and 48, each of which is formed into a shape to suit the outer surface of the reel 6, are disposed in the lower portion of an intermediate portion of the reel side plate 41.

Furthermore, a separation plate 49 which halves the width of the body frame 40 is fastened to the top surface of an intermediate portion of the body frame 40. In addition, a reel shaft 50 is disposed in the upper portion of the above-described separation plate 49 in such a manner that the reel shaft 50 penetrates into the separation plate 49. Furthermore, two take-up reels 51 and 52 are rotatably fastened to the two end portions of the reel shaft 50 in such a manner that the two take-up reels 51 and 52 hold the separation plate 49. Each of the above-described take-up reels 51 and 52 is formed into a shape having a large flange adjacent to the separation plate 49 so as to form take-up ratchets 53 and 54 each having a gear portion formed on the outer surface of the flange.

In addition, a supporting shaft 55 is disposed in the upper portion of the separation plate 49, the supporting shaft 55 holding two drive levers 56, 57 and two take-up ratchet levers 58 which are pivotally fastened in such a manner that they hold therebetween the separation plate 49. The above-described drive levers 56, 57, and the take-up ratchet levers 58 are arranged to act in association with one another by the action of a connection pin 59. Furthermore, a feeding ratchet claw 60 is connected to the front portion of each of the above-described take-up ratchet lever 58, the feeding ratchet claws 60 being engaged to the take-up ratchets 53 and 54 of the take-up reels 51 and 52. In addition, a tension spring 61 is arranged between the take-up ratchet levers 58, the tension spring 61 acting to rotate and restore the drive lever 56 or 57 in a direction designated by an arrow $Y_2$ when the drive lever 56 or 57 is rotated in a direction designated by an arrow $Y_1$.

Furthermore, reverse-rotation protection claws 62 are disposed on the two sides of the above-described separation plate 49, the reverse-rotation.. protection claws 62 always being engaged with the take-up ratchets 53 and 54 of the above-described take-up reels 51 and 52 to check the reverse rotation of the take-up reels 51 and 52. In addition, cover tape guide rollers 63 are disposed on the two sides of an intermediate portion of the above-described separation plate 49, the cover tape guide rollers 63 acting to guide the cover tapes 4. Furthermore, a guide plate 64 is disposed on either side of the lower portion of the separation plate 49, the guide plate 64 acting to guide the taped electronic group 5 drawn out from the reel 6 disposed on the front stage.

In addition, connection rings 65 and 66 are respectively connected to the above-described drive levers 56 and 57, the connection rings 65 and 66 extending to a recessed portion 67 formed in the front portion of the body frame 40. That is, the connection rings 65 and 66 pass through a slit 68 formed in the central portion of the top surface of the body frame 40 before the leading portions of the connection rings 65 and 66 are introduced into a recessed portion 67. Then, the above-described leading portions are connected to end portions of the right and left reverse-rotation levers 70 rotatively fastened to the support shaft 69. A tension spring 71 is arranged between the above-described reverse-rotation levers 70, the tension spring 71 acting to rotate and restore the reverse-rotation lever 70 after it has been rotated by the rotations of the drive levers 56 and 57 transmitted via the connection rings 65 and 66.

Furthermore, a connection lever 72 is connected to the above-described reverse-rotation lever 70. The front portion of the above-described connection lever 72 is connected to a feeding ratchet lever 75 positioned in the recessed portion 67 and fastened together with a feeding ratchet 74 rotatively fastened to a supporting shaft 73. The above-described feeding ratchet lever 75 has a ratchet claw 76 to be engaged to the above-described feeding ratchet 74 and acting to intermittently rotate the feeding ratchet 74. Furthermore, a reverse-rotation prevention lever 77 is disposed on the outer surface of the feeding ratchet 74 in such a manner that the reverse-rotation prevention lever 77 is always engaged to the feeding ratchet 74 by the urging force generated by a spring 78.

In addition, a carrier tape feeding ratchet wheel 79 is integrally formed with the above-described feeding ratchet 74 in such a manner that a portion of it projects over the top surface of the leading portion of the body frame 40 so as to convey the carrier tape 2 in such a way that it is engaged to a conveyance hole 3 formed in the carrier tape 2. Tape retainers 80 and 81 are fastened to the top surface of the leading portion of the body frame 40, the tape retainers 80 and 81, acting to guide the taped electronic element groups 5 respectively supplied from the reels 6, after they are separated from each other by the separation plate 49 in such a manner that they are engaged to the above-described carrier tape feeding ratchet wheel 79. Each of the tape retainers 80 and 81 has a slit 82 and an opening portion 83 so as to take out the cover tape 4 separated from the carrier tape 2 through the above-described slit 82 before it is guided by the above-described cover tape guide roller 63. As a result, the cover tapes 4 are wound around the take-up reels 51 and 52.

The opening portions 83, respectively formed in the tape retainers 80 and 81, are disposed in front of the above-described slits 82. Opening portions 83 serve as portions through which the chip-type electronic elements 1, accommodated in the recessed portion 2a of the carrier tape 2, are acted on by an adsorbing nozzle fastened to an electronic-element fastening apparatus. Shutters 84 and 85 are movably disposed on the top surfaces of the tape retainers 80 and 81, the shutters 84 and 85 respectively having fastening cut portions at positions deviated from the width of the carrier tape 2 so as to be fastened to the leading portion of a connection plate 87 connected to the above-described reverse-rotation lever 70. As a result, the opening portions 83 formed in the tape retainers 80 and 81 are covered when the carrier tape 2 is conveyed by the carrier tape feeding ratchet wheel 79. Therefore, undesirable ejection of the chip-type electronic elements 1 through the recessed portion 2a formed in the carrier tape 2 is prevented.

The operation of the apparatus thusconstituted will now be described.

First, the above-described reels 6 are rotatively fastened to the reel shafts 43 and 44 fastened to the reel side plates 41 secured to the end portion of the body frame 40 in the longitudinal direction with respect to the supply direction. In order to feed the taped electronic group 5 wound around the reel 6 by a predetermined quantity, the conveyance holes 3 formed in the carrier tape 2 are caught to the carrier tape feeding ratchet wheel 79. The feeding ratchet lever 75, for driving the ratchet feeding claw 76 to be engaged to the feeding ratchet 74 formed integrally with the carrier tape feeding ratchet wheel 79, is driven in such a manner that the drive levers 56 and 57 are driven by an electronic-element automatic fastening apparatus via the reverse-rotation lever 70 and the connection lever 72, in accordance with the operation of the connection rings 65 and 66 with connecting lever 72. When the drive levers 56 and 57 are rotated in the direction $Y_1$, the carrier tape 2 is returned by one pitch in the direction opposing the feeding direction. When the ratchet feeding claw 76 is then introduced into a portion between the teeth of the feeding ratchet 74, the carrier tape 2 is fed by a predetermined pitch by the action of the tension spring 71. In association with the above-described sequential feeding mechanism, the above-described cover tape 4 is turned by an angle of about 180° and is taken out in a direction opposite to the direction in which the carrier tape 2 is fed, at the position of the slit 82 positioned in a slightly upstream (adjacent to the reels 6) of the opening portion 83 through which the electronic elements are taken out. Then, the cover tape 4 is separated from the carrier tape 2 before it is wound around the take-up reels 51 and 52. When the above-described drive levers 56 and 57 are moved in the direction $Y_1$, the ratchet levers 53 and 54 disposed within the width of the take-up reels 51 and 52 having the same supporting shaft 55 as that of the drive levers 56 and 57 are upwards moved via the connection pin 59 secured to the drive levers 56 and 57. Thus, the take-up ratchets 53 and 54 disposed on the outer periphery of the flanges of the take-up reels 51 and 52 are returned by one or a plurality of pitches in the reverse direction by the feeding ratchet claw 60. Furthermore, when the drive levers 56 and 57 are returned in the direction $Y_2$ by the tension spring 61, the take-up reels 51 and 52 are rotated in the winding direction simultaneously with the sequential feeding made by predetermined pitches. The structure is arranged in such a manner that one body frame 40 has two systems, each of which is composed of the above-described sequential mechanism system, the two sequential mechanism systems being disposed to oppose each other with respect to the fastening surface formed between two the carrier tapes 2.

When the carrier tape 2 is fed by predetermined pitches by the above-described feeding ratchet 74, the shutters 84 and 85 disposed on the top surfaces of the two individual tape retainers 80 and 81 fastened to the body frame 40 are connected to the above-described drive levers 56 and 57 by the reverse lever 70 and the connection plate 87. As a result, the opening portion 83 through which the electronic elements are taken out is covered and the carrier tape 2 is fed by predetermined pitches in a state where the chip-type electronic elements 1 are covered by the shutters 84 and 85. Therefore, undesirable pop-out of the chip-type electronic elements 1 from the recessed portion 2a formed in the carrier tape 2 can be prevented. Furthermore, the fastening cut portion is formed on the right end surface of each of the shutters 84 and 85 while being deviated from the width of the carrier tape 2. The leading portion of the above-described connection plate 87 is inserted into the above-described fastening cut portion and the shutters 84 and 85 are driven. Therefore, the width of the shutter mechanism can be reduced.

Figure 4:
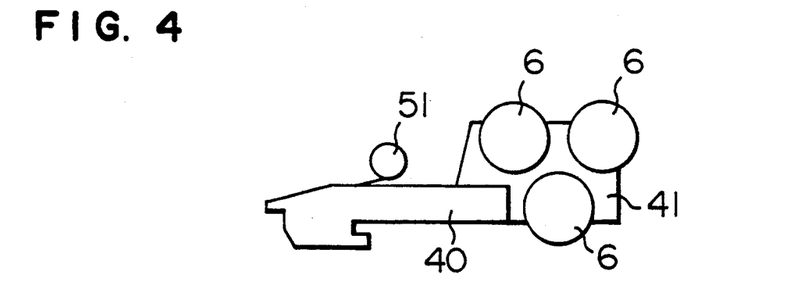
FIG. 4 is a schematic view which illustrates another embodiment of the present invention.
Figure 5:
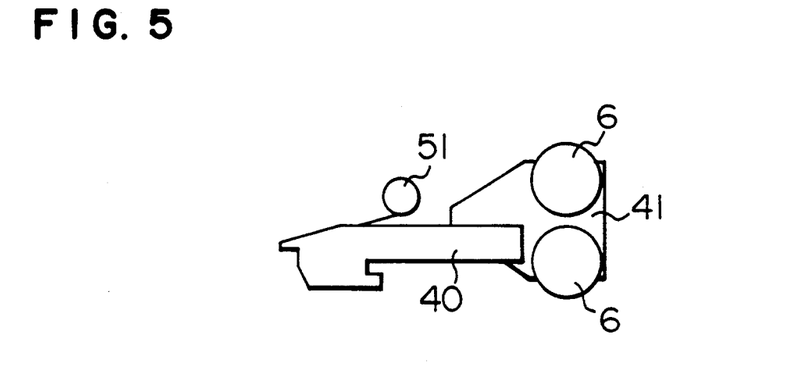
FIG. 5 is a schematic view which illustrates another embodiment of the present invention.
Figure 6:
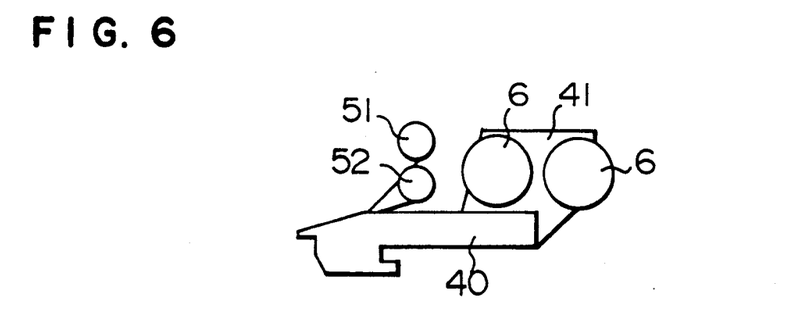
FIG. 6 is a schematic view which illustrates another embodiment of the present invention.
Figure 7:
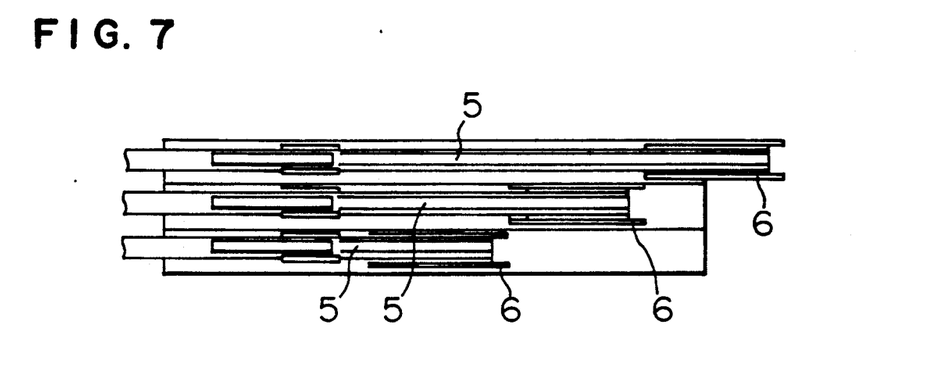
FIG. 7 is a plain layout view which illustrates the arrangement of the reels according to another embodiment of the present invention.
Figure 8:
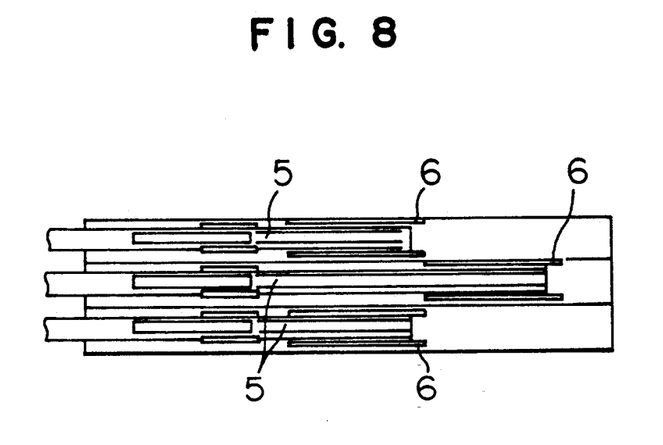
FIG. 8 is a plain layout view which illustrates the arrangement of the reels according to another embodiment of the present invention.
Figure 9:
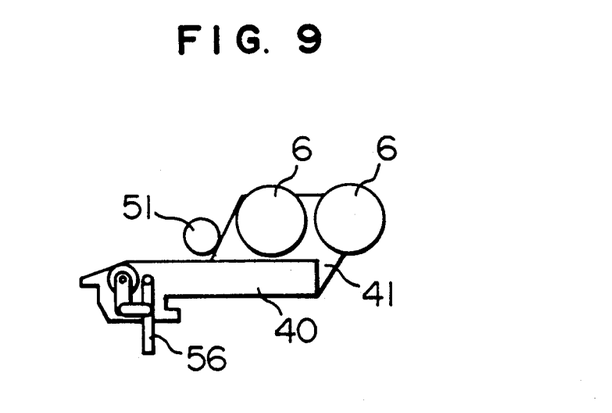
FIG. 9 is a schematic view which illustrates another embodiment of the present invention.

A variety of modifications to the above-described embodiment may be employed. The reels 6 may be disposed as shown in FIG. 4 in such a manner that two reels 6 are longitudinally disposed and another reel is disposed below the two reels 6. Another structure as shown in FIG. 5 may be employed in which two reels 6 are disposed vertically. A structure as shown in FIG. 6 may be employed in which the take-up reels 51 and 52 are vertically disposed. Other structures as shown in FIGS. 7 and 8 may be employed in each of which a plurality of reels 6 are disposed in parallel with respect to the supply direction. In addition, a structure as shown in FIG. 9 may be employed in which the drive levers 56 and 57 are disposed adjacent to the recessed portion 67 formed in the body frame 40.

Figure 10:
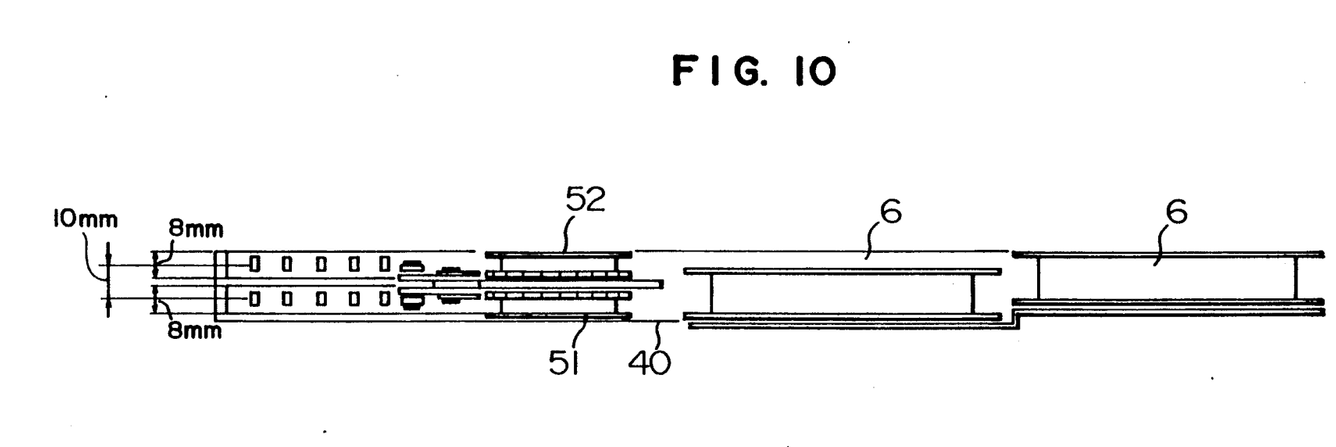
FIG. 10 is a plan view which illustrates the width of the apparatus according to the present invention.

As described above, according to the present invention, a dual-type chip electronic element supplying apparatus can be constituted while making its width which is, as shown in FIG. 10, substantially the same as the width of the related-art chip-type electronic element supply apparatus. Therefore, many and various chip-type electronic elements 1 can be supplied when the structure according to the present invention is used while being combined with the apparatus for automatically mounting electronic-elements.

Figure 11:
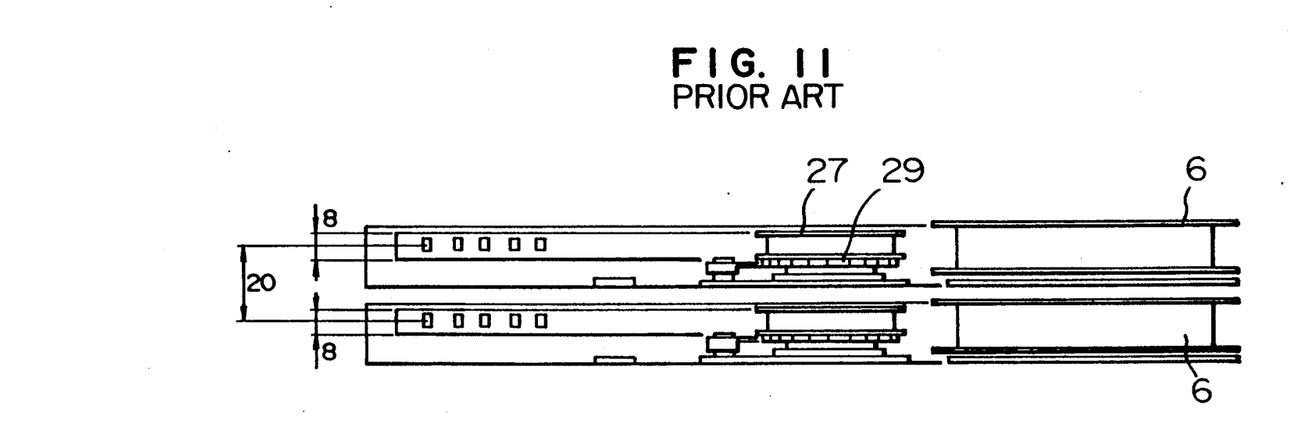
FIG. 11 is a plan view which illustrates a conventional dual-type apparatus.
Figure 12A:
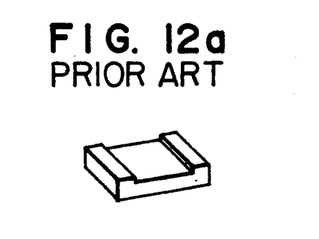
FIGS. 12a to FIG. 12d are perspective views which illustrate the chip-type electronic elements.
Figure 12B:
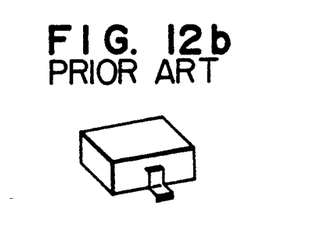
Figure 12C:
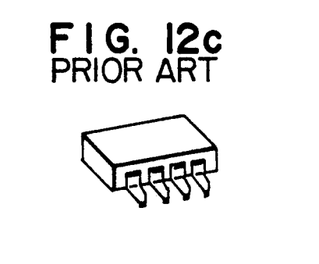
Figure 12D:
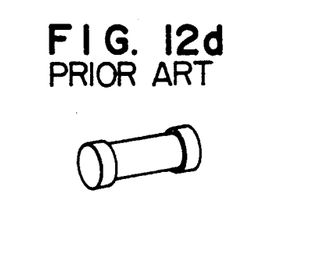

As described above, the chip-type electronic element supplying apparatus according to the present invention enables an effect to be obtained in that a limit pitch (10 mm) can be realized which is the half of that realize by the related-art chip-type electronic element supplying apparatus (see FIGS. 10 and 11). Therefore, an extremely improved chip-type electronic element supplying apparatus with which the mounting tactic of the automatic mounting apparatus can be improved can be provided. Therefore, the apparatus according to the present invention is expected to be used widely in the industrial field and thereby a significant advantage will be obtained.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A chip-type electronic element supplying apparatus for supplying chip-type electronic elements from taped electronic element groups, each of said groups including a carrier tape provided with accommodating portions which accommodate said chip-type elements and a cover tape applied on said carrier tape, said chip-type electronic element supplying apparatus comprising:

a body frame, having a recessed portion formed at a first end portion;

a plurality of reels, each of said reels having one of said taped electronic element groups wound thereon;

reel side plates, disposed at a second end portion of said body frame, for rotatively fastening said plurality of said reels;

tape feeding mechanisms, disposed in said recessed portion, each of said tape feeding mechanisms including a feeding means which is engaged to a carrier tape of one of said taped electronic groups, said feeding means for intermittently coveying said carrier tape; wherein a number of said feeding mechanisms corresponds to a number of said plurality of reels;

tape retainers disposed above said feeding mechanisms;

a cut portion for separating cover tape from carrier tape of said taped electronic groups;

a cover tape take-up portion, disposed in an intermediate portion of said body frame, for receiving said cover tape separated from said carrier tape and providing said separated cover tape to a portion of said tape retainers for taking up said separated cover tape, said cover tape-up portion comprising tape-up reels each having flanges and each being arranged such that an outer portion of at least one of its flanges has a gear shape take-up ratchet, each of said take-up ratchets including said at least one flange;

a drive mechanism, for said tape-up ratchets, disposed to be in alignment with said take-up reels of said cover tape take-up portion; and an element taking-out portion, disposed in a front portion of said tape retainers, through which said chip-type electronic elements are taken out from said carrier tape.

2. A chip-type electronic element supplying apparatus according to claim 1, wherein a drive lever, for driving said feeding mechanisms, is aligned with said taped electronic element groups at an intermediate portion of said body frame.

3. A chip-type electronic element supplying apparatus according to claim 1, further comprising shutters for opening and closing an opening portion of said element taking-out portion; and a connection plate of said shutters, fastened to one of said tape retainers at a position not in alignment with said taped electronic element groups.

* * * * *